(12) United States Patent
Böcker et al.

(10) Patent No.: US 9,960,574 B2
(45) Date of Patent: May 1, 2018

(54) APPARATUS FOR DISTRIBUTING CURRENT IN A LOW-VOLTAGE SYSTEM

(71) Applicant: Weidmüller Interface GmbH & Co. KG, Detmold (DE)

(72) Inventors: Marc Böcker, Steinheim (DE); Michael Gerkens, Bielefeld (DE); Andreas Hähnel, Hüllhorst-Schnathorst (DE); Stephan Lange, Lemgo (DE); Klaus Schürmann, Lage (DE); Ralph Tempel, Detmold (DE)

(73) Assignee: Weidmüller Interface GmbH & CO. KG

( * ) Notice: Subject to any disclaimer, the term of this patent is extended or adjusted under 35 U.S.C. 154(b) by 0 days. days.

(21) Appl. No.: 15/119,285

(22) PCT Filed: Feb. 24, 2015

(86) PCT No.: PCT/EP2015/053854
§ 371 (c)(1),
(2) Date: Aug. 16, 2016

(87) PCT Pub. No.: WO2015/124800
PCT Pub. Date: Aug. 27, 2015

(65) Prior Publication Data
US 2017/0047714 A1    Feb. 16, 2017

(30) Foreign Application Priority Data
Feb. 24, 2014   (DE) .................... 20 2014 100 829 U

(51) Int. Cl.
*H02B 1/20*     (2006.01)
*H01R 9/26*     (2006.01)
*H02J 1/06*     (2006.01)
*H05K 7/02*     (2006.01)
*H05K 7/14*     (2006.01)
*H02B 1/052*    (2006.01)
*H02J 1/00*     (2006.01)
*H05K 5/02*     (2006.01)

(52) U.S. Cl.
CPC .......... *H02B 1/205* (2013.01); *H01R 9/2675* (2013.01); *H02B 1/052* (2013.01); *H02J 1/00* (2013.01);
(Continued)

(58) Field of Classification Search
CPC ......... H01L 2924/00; H01L 2924/0002; H01L 2924/00014; G11C 11/56; G11C 7/22;
(Continued)

(56) References Cited

U.S. PATENT DOCUMENTS 3,054,024 A    9/1962  Van Dillen et al.
3,321,744 A *  5/1967  Jensen .................. B23Q 15/00
                                                 318/162

(Continued)

*Primary Examiner* — Adam B Dravininkas
(74) *Attorney, Agent, or Firm* — Laubscher, Spendlove & Laubscher, P.C.

(57) ABSTRACT

An apparatus for distributing current in a low-voltage system includes a plurality of disk-shaped modules that can be arranged adjacent to each other in a row and mounted or locked on a carrier rail. At least one supply module, at least one fuse module, and at least one distributing module are provided. The modules have at least one cross connector for a positive potential and at least one cross connector for a negative potential. The fuse module and the distributing module also have at least one additional cross connector for a potential that is protected by the fuse module.

10 Claims, 5 Drawing Sheets

(52) U.S. Cl.
CPC .............. *H02J 1/06* (2013.01); *H05K 5/0256* (2013.01); *H05K 7/023* (2013.01); *H05K 7/1459* (2013.01)

(58) Field of Classification Search
CPC ........... G11C 5/147; G11C 7/106; G11C 7/10; G06F 21/79; G06F 21/86; G06F 2221/2129; H05K 1/189; H05K 1/14
See application file for complete search history.

(56) References Cited

U.S. PATENT DOCUMENTS

| | | | | |
|---|---|---|---|---|
| 3,818,183 A | * | 6/1974 | Masson | .................. G01K 1/024 219/483 |
| 4,680,674 A | | 7/1987 | Moore | |
| 6,881,101 B2 | * | 4/2005 | Sichner | ................ H01R 13/514 439/278 |
| 8,559,258 B1 | * | 10/2013 | Stephens, Jr. | ..... G11C 11/40615 365/211 |
| 2008/0090139 A1 | * | 4/2008 | Hurst | .................. H01M 2/1016 429/156 |
| 2008/0253085 A1 | * | 10/2008 | Soffer | ....................... G06F 1/18 361/679.4 |
| 2012/0024337 A1 | * | 2/2012 | Bellacicco | .............. H02S 40/36 136/244 |
| 2012/0212870 A1 | * | 8/2012 | Necco | .................. H02H 11/002 361/86 |
| 2014/0210369 A1 | * | 7/2014 | Gibbs | ................ H05B 33/0848 315/193 |
| 2015/0212123 A1 | * | 7/2015 | Tyrrell | ................ G06F 13/4291 702/89 |
| 2015/0258961 A1 | * | 9/2015 | Doherty | ................ B60R 25/042 701/2 |

* cited by examiner

APPARATUS FOR DISTRIBUTING CURRENT IN A LOW-VOLTAGE SYSTEM

CROSS-REFERENCE TO EARLIER APPLICATIONS

This application is a § 371 national phase entry of PCT International Application No. PCT/EP2015/053854 filed Feb. 24, 2015. PCT/EP2015/053854 claims priority to Patent Application No. DE202014100829.2 filed Feb. 24, 2014. The entire content of these applications is incorporated herein by reference.

BACKGROUND OF THE INVENTION

The invention relates to an assembly for distributing current in a low-voltage system including a plurality of disk-shaped modules arranged in series and mounted on a carrier or support rail. At least one of the modules is a supply module, at least one is a fuse module and at least one is a distributor module.

BRIEF DESCRIPTION OF THE PRIOR ART

Systems for industrial automation, for automating buildings or for monitoring technical processes frequently include components which are supplied with direct current in the low-voltage range, frequently in the range of 24 volts. Such components include for example, input/output units of industrial control systems, sensors and measured value receivers or transducers for the evaluation of sensor signals.

Since a plurality of such components to be supplied with direct current in the low voltage range can be present in rather large systems, a current supply device that is used in common by several components is appropriate. Accordingly, the direct current made available from the current supply device must be distributed to the components, with individual components or a group of these components preferably being secured.

Fuse modules are known in the art which include electronic or conventional electromechanical safety fuses connected between the current supply device and one or more of the components to be supplied with current. Furthermore, distributor clamps are known in the art which are used for the distribution of different potentials such as positive and negative output potentials of the current supply device and secured potentials. The fuse modules and the distributor clamps are preferably provided with a receiving device for mounting on a carrier rail. Therefore, it is possible to provide a mounting device inside a switch box customarily used for the industrial automation or building automation. A disadvantage of the known fuse modules and distributor clamps is the excessive amount of wiring required for connecting the individual modules with each other.

One problem the present invention seeks to resolve is to provide an apparatus for the distribution of current in a low-voltage system that can be constructed with low wiring costs. The current distribution should be flexible and allow for the supply of current to as many components as possible in any distribution of differently secured groups.

SUMMARY OF THE INVENTION

An apparatus in accordance with the invention includes at least one supply module, at least one fuse module and at least one distributor module each having at least one connection for a cross connector for a positive potential and one connection for a cross connector for a negative potential. The fuse module and the distributor module also have at least one other connection for at least one other cross connector for a potential secured by the fuse module.

The supply, securing, and distribution operations of the apparatus are distributed onto different modules. However, the modules can be combined in any manner among themselves by the cross connectors for the supplied current and by the at least one other cross connector for the secured current. Accordingly, current distribution can be obtained without expensive wiring. One or more fuse modules can be associated with a supply module with which distributor modules are connected. Therefore, starting from a supply module which is connected, for example to a current supply device, several individually secured subgroups of current-consuming components can be supplied.

The cross connectors are preferably constructed with a given maximum current load capacity that is the same for all cross connectors. This applies in particular to the cross connector which distributes the negative potential of the current supply device. In this manner, beginning with the supply connections, all current made available from a current supply device can be distributed without any additional auxiliary wiring.

In a preferred embodiment, the fuse module includes at least one electronic fuse. The fuse module preferably includes at least one fuse operating in a two-pole manner. A system providing two-pole security without excessive wiring can also be constructed with the other cross connectors. In addition, both potentials required for two-pole separation are available from the distribution of the positive and negative infeed potential already on each fuse module.

In another preferred embodiment, the distributor module includes a separating element through which terminal connections are connected to the connections for the cross connector. The separating element may include, for example, a removable bridge. The separation can be carried out in a single-pole or all-pole manner. The separating element affords a simple way to disconnect a single component or a group of components from a current supply, for example, for servicing.

According to a further embodiment of the invention, the supply module includes a ground connection and a separating element. The ground connection is connected via the separating element to one of the connections for the cross connectors. In many low-voltage systems the negative potential or negative pole is placed on a ground potential, which is therefore readily available via the ground potential of the supply module. The separating element provides separation of the ground connection, for example for maintenance or for carrying out insulation measurements. Alternatively, the separating element can also be replaced by a fixed, non-separable electrical connection.

According to another embodiment of the invention, the connections for the cross connectors are designed for connection via a through cross connector. In other words, the connections for the particular cross connector are provided on the housings of the individual modules in such an alignment that they can be connected to each other by a cross connector that can be readily constructed and can therefore be readily and flexibly cut to length.

In another preferred embodiment of the invention, the fuse module includes at least one connection for an additional cross connector for transmitting an alarm signal and/or a control signal. The additional cross connector is preferably constructed as a data bus and preferably as a single-wire data bus in order to transmit alarm and/or control signals in an encoded form. In this manner, control and alarm signals of one or several fuse modules can be transmitted in a combined manner via the data bus. Instead of a plurality of individual control connections and/or alarm connections that must be provided and wired on each fuse module, simple wiring via cross connectors can be made for control signals and/or alarm signals.

In order to evaluate the control signals and/or alarm signals, the apparatus includes a signal processing module with at least one connection for the additional cross connector which includes alarm signal and/or control signal connections on which the alarm signals and/or control signals exchanged via the data bus are made available in decoded form. Alternatively, a supply module with at least one connection for the additional cross connector can be provided and includes alarm signal and/or control signal connections. Moreover, the supply module includes a bus decoder which provides the alarm signals and/or control signals exchanged via the data bus in decoded form on the alarm signal and/or control signal connections. Therefore, control and/or alarm signal wiring for several fuse modules can be combined on the signal processing module or the supply module provided with a bus decoder.

BRIEF DESCRIPTION OF THE FIGURES

Other objects and advantages of the invention will become apparent from a study of the following specification when viewed in the light of the accompanying drawing, in which.

DETAILED DESCRIPTION

Figure 1:
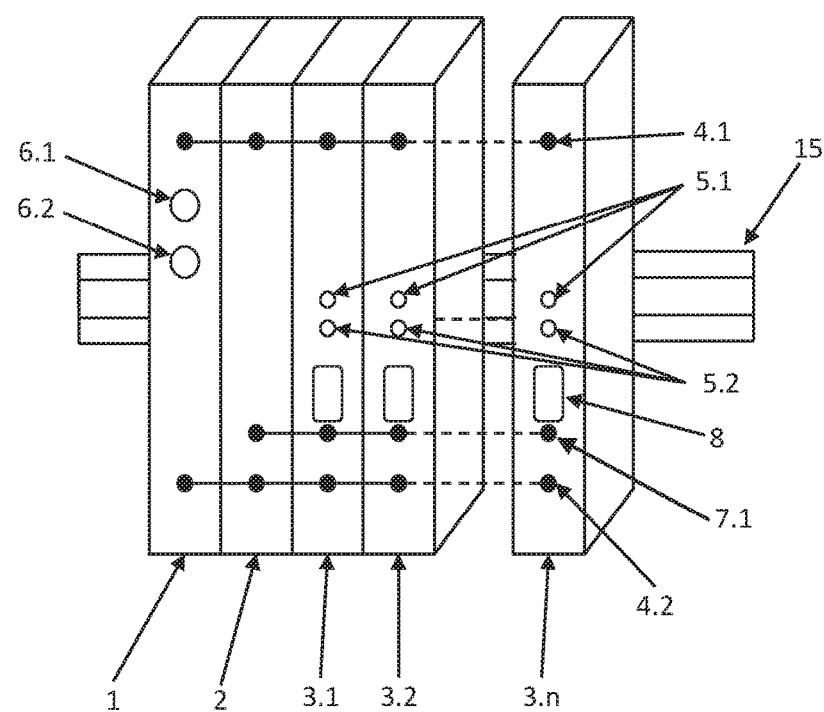
FIG. 1 is a perspective view of an assembly of a plurality of modules for current distribution in a low voltage system according to a preferred embodiment of the invention.

FIG. 1 is a schematic block diagram of an assembly of several modules for current distribution in a low-voltage system which can be mounted on a carrier rail 15. Each module includes connections for various cross connectors as will be developed below.

In this assembly, a supply module 1 is provided with positive and negative terminals 6.1 and 6.2 to which single-pole connection cables having a large conductor cross section are connected to supply current from a current supply device. The current supply device, not shown, can also be mounted on a carrier rail and provides a low voltage, for example a voltage of 24 volts (V), with a load capacity of a few amperes (A) up to approximately 100 A.

The current supplied on the terminals 6.1 and 6.2 is distributed from the assembly shown in FIG. 1 to a plurality of components or modules.

More particularly, cross connectors are formed on the supply module 1 and extend transversely relative to the modules, i.e. in the direction of the carrier rail 15. The cross connectors 4.1 and 4.2 are single-pole, rod-shaped conductors such as bus bars. Alternatively, comb rails can be used as cross connectors 4.1 and 4.2. One cross connector, for example the cross connector 4.1, provides a positive supply potential while the other cross connector, for example the cross connector 4.2, provides a negative supply potential.

The potential supplied to the terminals 6.1 and 6.2 is distributed via series connected first cross connectors 4.1 and 4.2 to other modules. In the example shown in FIG. 1, a fuse module 2 is connected as another module which secures at least one of the two potentials supplied via the cross connectors 4.1 and 4.2. The fuse module 2 can be an electronic, electromechanical or safety fuse. The secured potential is provided on a second cross connector 7.1 from which it is distributed to other modules. In the example shown, the second cross connector 7.1 in the fuse module 2 is connected via the fuse to the cross connector 4.1 for the positive potential. Therefore, the positive potential is forwarded in a secured manner via the cross connector 7.1. The second cross connector 7.1 can also be constructed as a bus bar or as a comb rail similar to the first cross connectors 4.1 and 4.2.

At least one distributor module is connected with the fuse module 2. In the example shown, a plurality of distributor modules 3.1, 3.2 to 3.n are connected in series with the fuse module. The unsecured potential as well as the secured potential is supplied via the cross connectors 4.1, 4.2 and 7.1 from the supply module 1 or the fuse module 2 to the distributor modules.

The distributor modules 3 include paired conductor connections 5.1 and 5.2 on which the negative potential is made available directly from the connection of the cross connector 4.2 and the positive potential is secured from the connection of the cross connector 7.1 for the components to be supplied. In the embodiment shown in FIG. 1, only one conductor connection pair with conductor connections 5.1 and 5.2 is shown for each distributor module. Each distributor module can, however, include a plurality of pairs of conductor connections 5.1 and 5.2 which are connected in parallel with each other. The conductor connections 5.1 and 5.2 are formed, for example, as connection terminals or clamps, such as screw clamps or insertion clamps.

In addition, a separating device 8 can be provided for each distributor module 3 through which the conductor connections 5.1 and 5.2 can be separated from the cross connectors 4.2 and 7.1. The separating device 8 can be designed, for example as a removable bridge. Separation can be carried out in a single-pole manner or all-pole manner. The separating device 8 is operable to isolate or disconnect the current from a module such as for servicing an individual or group of modules or components.

All of the cross connectors 4.1, 4.2 and 7.1 are constructed with a maximum load capacity which is preferably the same for all cross connectors. This also applies in particular to the cross connector 4.2 which distributes the negative potential of the current supply unit. In this manner, starting from the conductor connections 5.1 and 5.2, all current made available from the current supply unit can be distributed without additional auxiliary wiring.

The assembly shown in FIG. 1 can be supplemented with another fuse module 2, such as on the right side, which is connected with the cross connectors 4.1 and 4.2 and makes another cross connector 7.1 available to which other distributor modules 3 can be connected.

Figure 2:
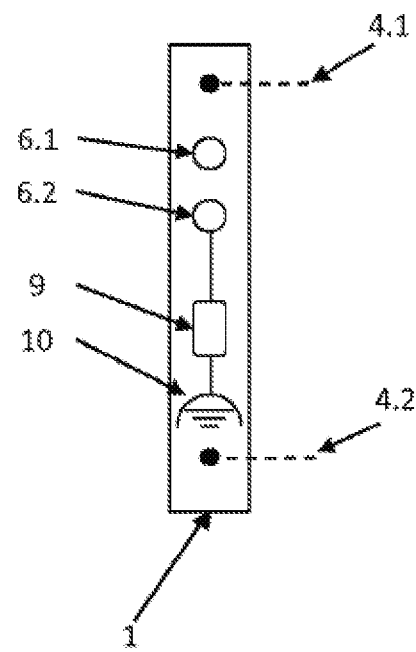
FIG. 2 is a schematic view of a fuse module for current distribution.

FIG. 2 shows a special embodiment of a supply module 1 which can be used, for example in the assembly according to FIG. 1. The supply module 1 shown in FIG. 2 has a ground connection 10 via which a ground potential can be put on the supply module 1. The terminal 6.2 is connected via a separating element 9 to the ground connection for supplying the negative potential to the current supply unit. In many low-voltage systems the negative potential (minus pole) is put on a ground potential, which is possible via the ground connection 10 of the supply module 1 here in a simple manner. The separating element 9 makes possible a separation of this ground connection, for example for maintenance or for carrying out insulation measurements. Alternatively, the separation element can also be replaced by a fixed, non-separable electrical connection.

Figure 3:
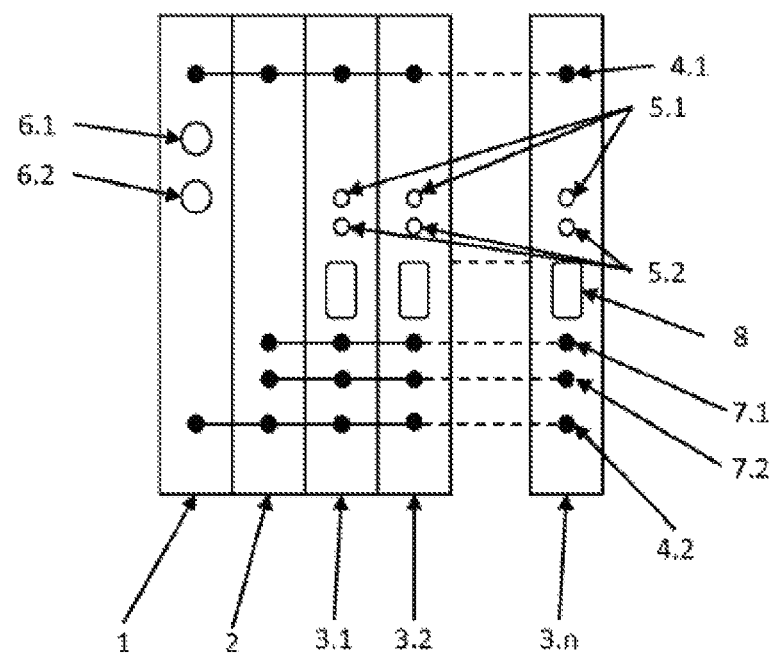
FIGS. 3-5 are schematic views of alternate embodiments, respectively, of a plurality of modules for current distribution.

FIG. 3 shows an assembly comparable to FIG. 1 for distributing current in a low-voltage system. As distinguished from the embodiment shown in FIG. 1, in the assembly shown in FIG. 3, the fuse module 2 is constructed as an all-pole fuse in which separation is carried out for both the positive and the negative potential. Accordingly, not only is the secured positive pole of the current supply forwarded via the cross connector 7.1 but also a secured negative pole of the current supply is forwarded via a second additional cross connector 7.2. While the other cross connectors 7.1 and 7.2 are positioned in the lower area of the modules in the example shown in FIG. 3, it is possible to arrange the other cross connector 7.1 adjacent to the cross connector 4.1 and the other cross connector 7.2 adjacent to the cross connector 4.2. The separating elements 8 can be constructed as described in connection with FIG. 1 for separating one or both potentials on the conductor connections 5.1 and 5.2.

Figure 4:
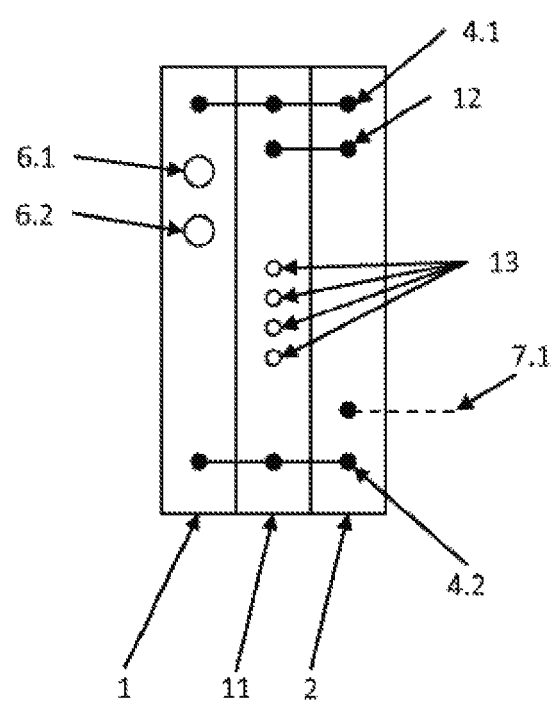

FIG. 4 shows another embodiment of the invention for current distribution in a low-voltage system. A supply module 1 is connected to a fuse module 2. Distributor modules 3 connected to the fuse module 2 (as in the embodiments of FIGS. 1 and 3) are not shown in this embodiment for clarity. In the embodiment of FIG. 4, the fuse module 2 is provided with a control functionality and/or alarm functionality. Fuse modules are known in the art include separate connection contacts via which a control signal can be supplied or an alarm signal emitted. In the system according to this embodiment, a bus line in the form of a third cross connector 12 is provided via which control signals as well as alarm signals can be transmitted and received by the fuse module 2. The bus line is preferably designed as a one-wire bus so that only one additional cross connector 12 is required. In order to decode the bus signals, a signal processing module 11 is provided which is connected via the additional cross connector 12 to the fuse module 2 and which makes the alarm signals and/or control signals available in decoded form on alarm and/or control signal connections 13.

Figure 5:
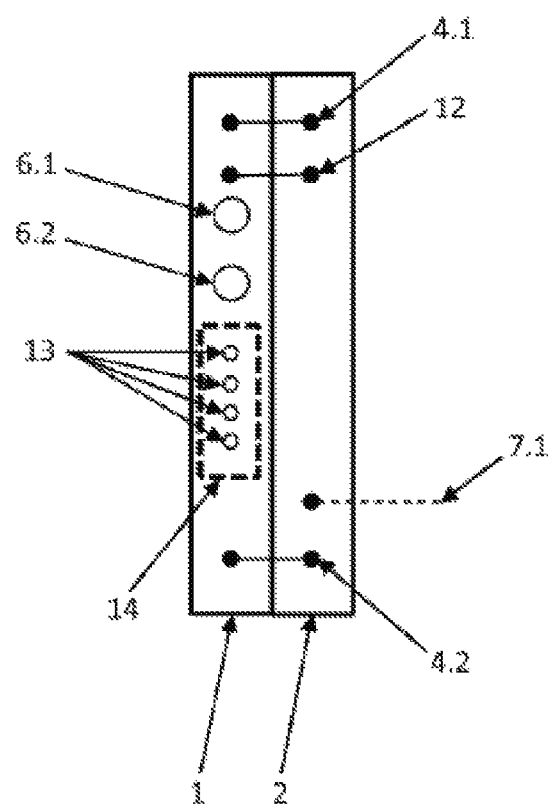

FIG. 5 shows an alternative embodiment to that of FIG. 4 for current distribution in a low-voltage system. In this embodiment, decoding of the bus signals does not take place in a separate signal processing module such as the signal module 11 of FIG. 4, but in a supply module 1 which includes an integrated bus decoder 14. Such a supply module 1 further includes a connection for the cross connector 12 as well as alarm and/or control signal connections 13.

It is especially advantageous if the signal processing module 11 shown in FIG. 4 or the supply module 1 shown in FIG. 5 are provided with an integrated bus decoder 14 for processing alarm and/or control signals of several fuse modules 2 which are all coupled to each other and to the signal processing module 11 and/or to the supply module 1 with an integrated bus decoder 14 via the additional cross connector 12. For example, a one-wire CAN (Controller Area Network) bus can be used as bus system.

While the preferred forms and embodiments of the invention have been illustrated and described, it will be apparent to those of ordinary skill in the art that various changes and modifications may be made without deviating from the inventive concepts set forth above.

The invention claimed is:

1. Apparatus for distributing current in a low-voltage system, comprising
   (a) a plurality of modules arranged in series and mounted on a carrier rail, said plurality of modules including at least one supply module, at least one fuse module and at least one distributor module;
   (b) a first cross connector connected between said plurality of modules for delivering a positive potential;
   (e) a second cross connector connected between said plurality of modules for delivering a negative potential; and
   (d) a third cross connector connected between a fuse module and a distributor module for delivering a secured potential from said fuse module.

2. Apparatus as defined in claim 1, wherein said fuse module comprises at least one electronic fuse.

3. Apparatus as defined in claim 1, wherein said fuse module comprises at least one fuse separating in a two-pole manner.

4. Apparatus as defined in claim 1, wherein said distributor module includes at least one conductor connector and a separating device connected between said at least one conductor connector and said cross connectors.

5. Apparatus as defined in claim 4, wherein said supply module includes a ground connection and a second separating device connected between said ground connection and said cross connectors.

6. Apparatus as defined in claim 1, wherein each of said cross connectors comprises a through, straight cross connector.

7. Apparatus as defined in claim 1, wherein said fuse module includes at least one third cross connector for transmitting at least one of an alarm signal and a control signal.

8. Apparatus as defined in claim 7, wherein said third cross connector comprises a single wire data bus for transmitting the at least one of an alarm signal and a control signal in encoded form.

9. Apparatus as defined in claim 8, and further comprising a signal processing module including at least one connection for said third cross connector and at least one signal connection through which said at least one of an alarm signal and a control signal is exchanged via the data bus in decoded form.

10. Apparatus as defined in claim 8, wherein said supply module includes at least one connection for said third cross connector, at least one signal connection through which said at least one of an alarm signal and a control signal is exchanged via a data bus, and a bus decoder for decoding said at least one of an alarm signal and a control signal.

* * * * *